(12) United States Patent
Yoshikawa

(10) Patent No.: US 6,853,071 B2
(45) Date of Patent: Feb. 8, 2005

(54) ELECTRONIC DEVICE HAVING DEWING PREVENTION STRUCTURE AND DEWING PREVENTION STRUCTURE OF ELECTRONIC DEVICE

(75) Inventor: Minoru Yoshikawa, Minato-ku (JP)

(73) Assignee: NEC Corporation, Tokyo (JP)

( * ) Notice: Subject to any disclaimer, the term of this patent is extended or adjusted under 35 U.S.C. 154(b) by 316 days.

(21) Appl. No.: 10/152,729

(22) Filed: May 23, 2002

(65) Prior Publication Data

US 2002/0175404 A1 Nov. 28, 2002

(30) Foreign Application Priority Data

May 24, 2001 (JP) ........................................ 2001-154794

(51) Int. Cl.[7] .............................................. H01L 23/34
(52) U.S. Cl. ...................................... 257/717; 257/712
(58) Field of Search ................................ 257/706, 707, 257/712, 713, 717; 438/122; 361/688, 704, 707, 709, 715, 719

(56) References Cited

U.S. PATENT DOCUMENTS

| | | | | |
|---|---|---|---|---|
| 5,126,829 A | * | 6/1992 | Daikoku et al. ............ | 257/713 |
| 5,574,627 A | * | 11/1996 | Porter ......................... | 361/719 |
| 6,054,676 A | * | 4/2000 | Wall et al. ................... | 219/209 |
| 6,144,013 A | * | 11/2000 | Chu et al. .................... | 219/209 |
| 6,243,268 B1 | * | 6/2001 | Kang et al. .................. | 361/715 |
| 6,246,581 B1 | * | 6/2001 | Kang et al. .................. | 361/700 |
| 6,292,365 B1 | * | 9/2001 | Ashiwake et al. .......... | 361/700 |

FOREIGN PATENT DOCUMENTS

JP    2000-101000    4/2000

* cited by examiner

Primary Examiner—David A. Zarneke
(74) Attorney, Agent, or Firm—Young & Thompson

(57) ABSTRACT

The electronic device includes a semiconductor device, a substrate on which the semiconductor device is mounted, a flange member for holding a peripheral portion of the substrate and a cooling member, in which the flange member for supporting the substrate of the semiconductor device being thermally in contact with the cooling member is arranged to come into contact with a heater through an adapter and between the heater and the cooling member, a heat insulating material is filled.

31 Claims, 7 Drawing Sheets

ELECTRONIC DEVICE HAVING DEWING PREVENTION STRUCTURE AND DEWING PREVENTION STRUCTURE OF ELECTRONIC DEVICE

BACKGROUND OF THE INVENTION

1. Field of the Invention

The present invention relates to an electronic device such as a multi-chip module having a dewing prevention structure.

2. Description of the Related Art

Not a few semiconductor devices as electronic devices have their operation performance improved by the cooling down below a room temperature. It is well known that because LSI such as CMOS, HEMT and the like, in particular, have the mobility of carriers in a semiconductor increased by a decrease in temperature, they can operate at a high speed when the temperature of a junction portion is decreased. It is also well known that decreasing the temperature of the whole chip leads to suppression of diffusion of impurities in the chip and migration of an internal wiring pattern, thereby improving reliability. Therefore, it is widely conducted to cool operation environments of these semiconductor devices down to a low temperature.

In low temperature cooling, however, when a surface temperature of a cooling member or a part mounted in the vicinity of the same (e.g. a substrate or a pin of a multi-chip module, or a packaging board on which a multi-chip module is mounted or the like) goes below a dew point temperature of the surrounding atmosphere, the surface is dewed. Dewing occurring at a pin of a multi-chip module causes such trouble as power supply short circuit, while dewing occurring at a substrate will cause migration of a substrate wiring.

Moreover, dewing occurring at a packaging board invites corrosion and when it occurs at other places, water drop falling on a packaging board and on a feeder pad or a signal pad on a packaging board will be a cause of a failure.

Under these circumstances, various structures have been proposed or put into practical use to prevent such dewing. Japanese Patent Laying-Open (Kokai) No. 2000-101000, for example, discloses a structure in which a pattern for heating is fabricated into the vicinity of a pin attachment surface of a multilayer wiring substrate in a multi-chip module. This structure is intended to increase a temperature of a pin to be higher than a dew point of the surrounding atmosphere in order to prevent dewing at the pin by sealing space above the multilayer wiring substrate by a module cap to which a cooler is attached, while sending an electric current to the heater in the multilayer wiring substrate.

Since in the structure proposed in the above-described literature, a semiconductor chip is sealed within the atmosphere of inert gas such as nitrogen by the multilayer wiring substrate and module cap, the module cap with the cooler mounted thereon directly attaches to the peripheral portion of the multilayer wiring substrate. As a result, pins disposed at the peripheral portion of the multilayer wiring substrate are liable to have a lower temperature than that of pins located at the central portion of the multilayer wiring substrate, thereby causing a temperature distribution in the pins at the peripheral portion of the substrate and those at the central portion of the same.

Accordingly, even when the pins at the central portion of the multilayer wiring substrate are set at an optimum temperature at which no dewing is caused, the pins at the peripheral portion of the multilayer wiring substrate will be in danger of dewing. In addition, since the multilayer wiring substrate is heated while being directly cooled, power consumed for cooling and heating will be increased.

SUMMARY OF THE INVENTION

An object of the present invention is to provide an electronic device having a dewing prevention structure for preventing temperatures of a substrate of an electronic device and a pin on the substrate, a packaging board on which the substrate is mounted and the like from falling below a dew point by evenly and efficiently heating the substrate, and a dewing prevention structure of an electronic device.

Another object of the present invention is to provide an electronic device having a dewing prevention structure which enables reduction in power consumed for cooling and heating because it can achieve heating effects on a substrate with less power consumption, and a dewing prevention structure of an electronic device.

A further object of the present invention is to enable an excessive temperature increase to be avoided, as well as enabling a decrease of temperatures of a substrate and a pin on the substrate, a packaging board on which the substrate is mounted and the like down below a dew point to be prevented without barely affecting an LSI junction temperature.

According to one aspect of the invention, an electronic device comprises a semiconductor device, a substrate on which the semiconductor device is mounted, a flange member for holding a peripheral portion of the substrate and a cooling member, a dewing prevention structure in which the semiconductor device and the cooling member are thermally connected by fixing the flange member to the cooling member, wherein the flange member has a heating function.

In the preferred construction, the flange member has a surface on which a heater is disposed.

In another preferred construction, the heater is disposed at an interface between the flange member and the cooling member and/or an interface between the flange member and the peripheral portion of the substrate.

In another preferred construction, the flange member is a heating element.

In another preferred construction, the flange member has a bottom surface portion in which an opening is formed at the central portion and a square cylinder portion standing upright at a peripheral portion of the bottom surface portion to hold the substrate at the bottom surface portion.

In another preferred construction, the flange member is fixed to the cooling member at a top face of the square cylinder.

In another preferred construction, the flange member is formed of metal.

In another preferred construction, the surface of the flange member is coated with an insulating material.

In another preferred construction, between the cooling member and the flange member, a heat insulating member is inserted.

In another preferred construction, the heat insulating member is formed of a plastic material having closed cells.

In another preferred construction, between the cooling member and the flange member, an adapter for regulating movement of the heat insulating material is inserted.

In another preferred construction, the heat insulating member is accommodated in the adapter.

In another preferred construction, the adapter is made up of at least a hollow support piercing through the heat insulating member, or at least the hollow support piercing through the heat insulating member and a plate-shaped adapter plate.

In another preferred construction, the adapter is formed of metal.

In another preferred construction, the adapter functions also as a heater.

In another preferred construction, at least the hollow support of the adapter is formed of ceramic or plastics.

In another preferred construction, on the surface of the substrate, a heat insulating insulation layer is formed.

In another preferred construction, the heating function is provided with a temperature control function of controlling the temperature of the flange member.

According to another aspect of the invention, a dewing prevention structure of an electronic device having a semiconductor device, a substrate on which the semiconductor device is mounted, a flange member for holding a peripheral portion of the substrate and a cooling member, wherein the semiconductor device and the cooling member are thermally connected by fixing the flange member to the cooling member, and the flange member has a heating function.

In the preferred construction, the flange member has a surface on which a heater is disposed.

In another preferred construction, the heater is disposed at an interface between the flange member and the cooling member and/or an interface between the flange member and the peripheral portion of the substrate.

In another preferred construction, the flange member has a bottom surface portion in which an opening is formed at the central portion and a square cylinder portion standing upright at a peripheral portion of the bottom surface portion to hold the substrate at the bottom surface portion.

In another preferred construction, the flange member is formed of metal and the surface of the flange member is coated with an insulating material.

In another preferred construction, between the cooling member and the flange member, a heat insulating member is inserted.

In another preferred construction, the heat insulating member is formed of a plastic material having closed cells.

In another preferred construction, between the cooling member and the flange member, an adapter for regulating movement of the heat insulating material is inserted.

In another preferred construction, the heat insulating member is accommodated in the adapter.

In another preferred construction, the adapter is made up of at least a hollow support piercing through the heat insulating member, or at least the hollow support piercing through the heat insulating member and a plate-shaped adapter plate.

In another preferred construction, the adapter functions also as a heater and at least the hollow support of the adapter is formed of ceramic or plastics.

In another preferred construction, on the surface of the substrate, a heat insulating insulation layer is formed.

In another preferred construction, the heating function is provided with a temperature control function of controlling the temperature of the flange member.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
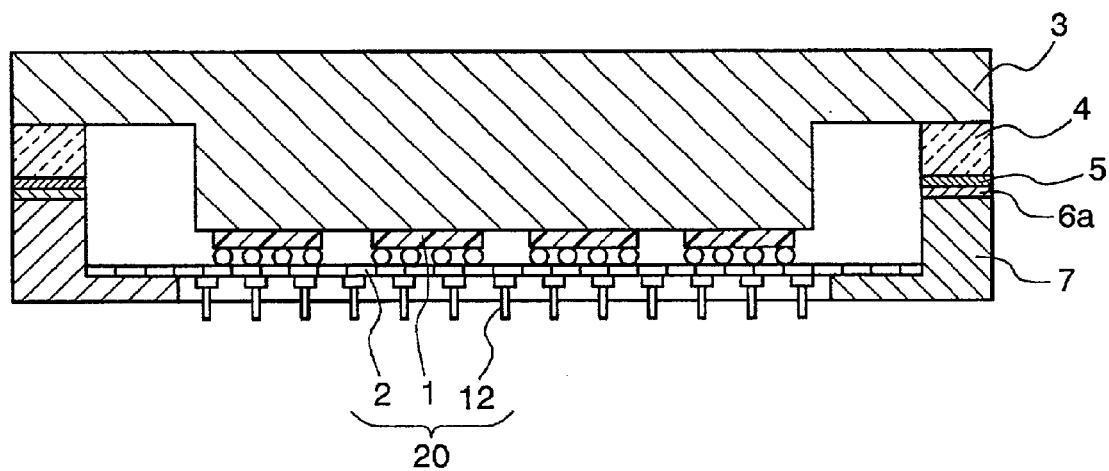
FIG. 1 is a sectional view showing a dewing prevention structure of an electronic device according a first embodiment of the present invention.

FIG. 1 is a sectional side view showing a first embodiment of an electronic device according to the present invention. A multi-chip module 20 includes a substrate 2 in which a plurality of pins 12 as external terminals are implanted, and a plurality of LSIs 1 having a CMOS circuit which are mounted on the substrate 2.

The LSI 1 as a component of the multi-chip module 20 is thermally connected to a cooling member 3. Between the surface of the LSI 1 on the cooling member side and the cooling member 3, a thermally conductive compound is filled in for absorbing variation in LSI packaging height and inclination.

The substrate 2 is a multilayer wiring substrate in which, with a ceramic material such as alumina or mullite or a metal material such as aluminum used as a base substrate, a wiring layer as a conductor provided on the substrate and an interlayer insulation layer for the insulation between the wiring layers are multi-layered, or a multilayer wiring substrate in which wiring substrates formed of a copper-plated glass epoxy substrate are multi-layered, and which has excellent heat conductivity in the direction parallel to the surface of the substrate.

In the present embodiment, also provided is a thin film insulation layer on the surface of the substrate 2 on the side on which the LSI 1 is mounted, for which polyimide is used whose heat conductivity is low as an insulation material. Polyimide is formed by spin-coating a precursor of polyimide and then heating the same. An insulation material for a thin film insulation layer is not limited to polyimide and any insulation material having low heat conductivity can be used. BCB (benzocyclobutene), for example, can be preferably used.

The cooling member 3 is cooled down below a room temperature for the purpose of operating the LSI 1 as a CMOS at a high speed. Among cooling systems are a liquid-cooling system for circulating a cooling medium such as water or antifreeze solution within a cooling member, a system using a freezing cycle and a system using a Peltier element making the use of endothermic action, any of which may be employed.

The multi-chip module 20 is held by a flange member 7. Although in the present embodiment, the substrate 2 is fixed to the bottom portion of the flange member 7 by screwing, it may be supported at the bottom portion of the flange member 7 in contact or may be fixed to the bottom surface of the flange member 7 by soldering or an adhesive.

On the flange member 7, a heater 5 is disposed through an adapter 6. The adapter 6 is composed of two portions, an adapter plate 6a and a support 6b (see FIG. 2). Between the heater 5 and the cooling member 3, a heat insulating material 4 is inserted. The flange member 7 is formed of such a metal having excellent heat conductivity as aluminum and has its surface supporting the substrate 2 in contact with the same from the side of the pin 12. The surface of the flange member 7 is coated with an insulation material.

Used as the heat insulating material 4 is a material having closed cells in order not to cause dewing within itself. In addition, a water absorption is desirably not more than a few percentages. As a heat insulating material having such properties, closed cell sponge rubber, for example, can be preferably used. The reason why the heat insulating material 4 is inserted between the heater 5 and the cooling member 3 is that heat of the heater 5 should be efficiently conducted to the flange member 7 without being absorbed by the cooling member 3.

As the heater 5, a popular heater such as a film heater can be used, for example.

A main function of the adapter 6 is to prevent the heat insulating member 4 as an elastic body to expand or shrink due to endothermic action by the cooling member or heat generated by the heater at the time when the LSI is operated while cooling is conducted by the cooling member. This arrangement prevents a space between the cooling member 3 and the LSI 1 from changing.

In the present invention, the substrate 2 has its surroundings supported by the heated flange member 7. As a result, heat transmitted from the flange member 7 to the substrate 2 will be transferred from the peripheral portion of the substrate toward the central portion of the same. This structure therefore enables even and efficient heating of the substrate.

Figure 2:
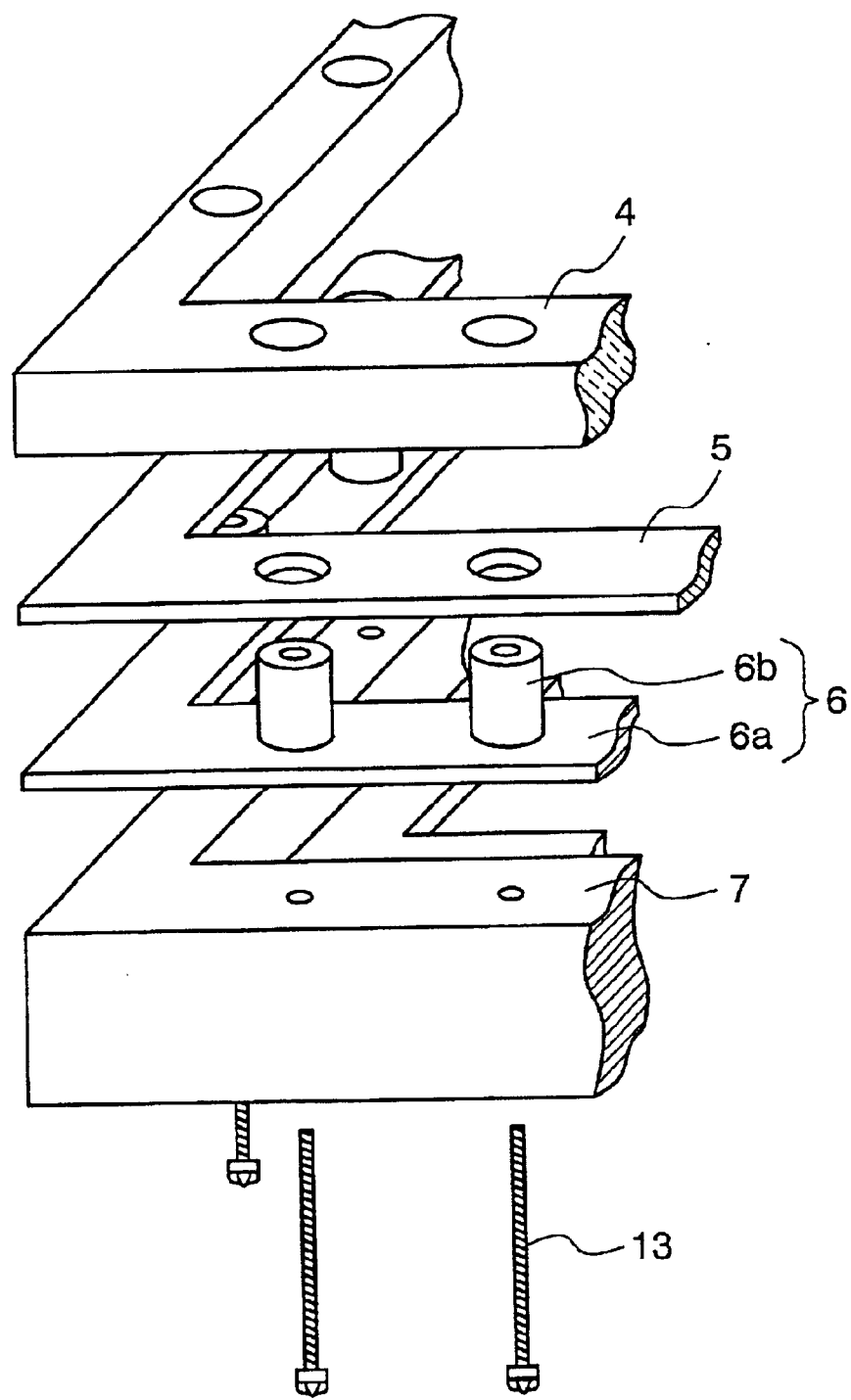
FIG. 2 is a partly exploded perspective view showing the dewing prevention structure of an electronic device according to the first embodiment of the present invention.

FIG. 2 shows an exploded perspective view of the heater portion. The adapter plate 6a is disposed along the upper surface of the flange member 7, on the upper surface of which plate the hollow support 6b is arranged. The adapter plate 6a and the hollow support 6b form the adapter 6.

It is preferable to select, as a material of the adapter plate 6a, a material having high heat conductivity in order to make heat conduction between the heater 5 and the flange member 7 excellent. Although aluminum is used in the present embodiment, other metal material such as copper can be suitably used.

It is preferable to use, for the support 6b, a material having low heat conductivity in order to prevent heat conduction between the flange member 7 and the cooling member 3. In the present embodiment, stainless steel is selected. Although no specific constraint is imposed on the size of the support 6b, it is desirable that the size should be approximately not more than half the width of the flange member in order to make heat conduction between the flange member 7 and the cooling member 3 small.

When the flange member 7, the adapter 6, the heater 5, the heat insulating material 4 and the cooling member 3 are piled up, there are formed a through hole for a screw 13 at a position of the flange member 7 with which the support 6b of the adapter 6 comes into contact, a through hole through which the support 6b can pierce at relevant positions of the heater 5 and the heat insulating material 4, and a female screw for the screw 13 at a relevant position of the cooling member 3.

The flange member 7 is strongly screwed to the cooling member 3 by means of the screw 13 with the adapter 6, the heater 5 and the heat insulating material 4 provided therebetween. A coefficient of thermal expansion of a metal is in general approximately 10–5/° C. and accordingly assuming that the support 6b is a few centimeters in length and that a temperature change ranges within several tens C, the length change of the support is as small as 0.01 mm. On the other hand, between the cooling member 3 and the LSI 1, there exists a space of approximately 0.1 mm. Even the support 6b has a temperature change of several tens ° C., the change in length is accordingly negligible as compared with the space between the LSI 1 and the cooling member 3.

It is better that the heat insulating material 4 should be filled without any space between the cooling member 3 and the heater 5 in order to increase heat insulating effects between the cooling member 3 and the heater 5.

Figure 3:
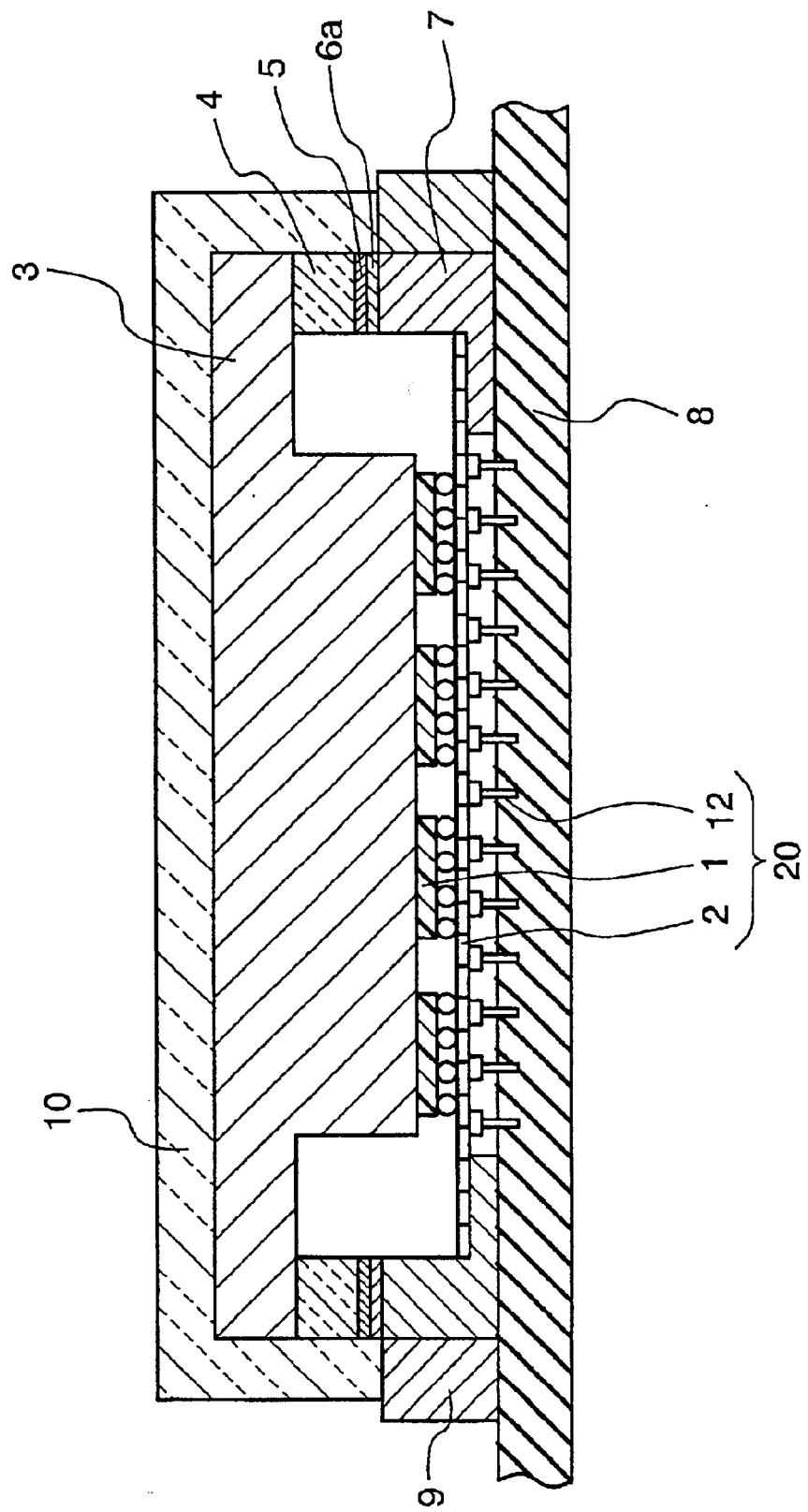
FIG. 3 is a sectional view showing a state where the electronic device of the first embodiment of the present invention is mounted on a packaging board.

FIG. 3 is a sectional view showing a state where the multi-chip module 20 is mounted on a packaging board 8 through the pin 12 of the substrate 2. Through a signal pad and a feeder pad provided in the packaging board 8, signal transmission and power feeding are conducted from the outside the module 20 to the LSI 1.

Provided on the packaging board 8 is a guide mechanism 9 for guiding the pin 12 so as to securely fit in a through hole of the packaging board 8 when the multi-chip module 20 is put on the packaging board 8.

Also in the present embodiment, a heat insulating cover 10 for covering the whole outer surface of the cooling member 3 is attached with the multi-chip module 20 mounted on the packaging board 8. Since sufficient space exists in this part, such a heat insulating cover can be used as has a heat insulating material of, for example, not less than 10 mm in thickness and not more than a few percentages in water absorption. When the heat insulating cover 10 should be thin, a surface temperature of the heat insulating cover 10 may be increased by covering the outer surface of the heat insulating cover 10 with the heater.

Next, operation of the dewing prevention structure according to the present invention will be described in more detail. First, description will be made of operation of the heater 5. Heat generated in the LSI 1 when the same is operated will be directly transmitted to the cooling member 3. At this time, by maintaining the cooling member at a low temperature, the CMOS formed in the LSI 1 will be cooled at a low temperature. Each CMOS is therefore allowed to operate at a high speed with high mobility.

Heat generated by feeding power to the heater 5 is passed through the adapter plate 6a and then is transmitted to the flange member 7. Since the adapter plate 6a is made of a material having excellent heat conductivity, the heat generated by feeding power to the heater 5 will be highly efficiently transferred to the flange member 7.

As a result, the flange member 7 is maintained at a temperature not less than a dew point temperature. Here, since the flange member 7 has its surface being in contact with the substrate 2, the flange member 7 will heat the substrate 2.

The substrate 2 is a multilayer wiring substrate in which, with a ceramic material such as alumina or mullite or a metal such as aluminum used as a base substrate, a wiring layer as a conductor provided on the substrate and an interlayer insulation layer for the insulation between the wiring layers are multi-layered, or a multilayer wiring substrate in which wiring substrates formed of a copper-plated glass epoxy plate are multi-layered, and which has excellent heat conductivity in the direction parallel to the surface of the substrate, making the temperature increase uniformly over the whole substrate.

Accordingly, since heat emitted from the flange member 7 and the substrate 2 will uniformly warm the internal space of the multi-chip module 20, dewing inside the multi-chip module 20 can be prevented.

Moreover, since a thin film insulation layer of polyimide or the like having low heat conductivity is formed on the surface of the substrate 2 at the side on which the LSI 1 is mounted, the heat transferred to the substrate is very unlikely to conduct to each CMOS in the LSI 1 to warm these CMOSs. As a result, a junction temperature of the CMOS in the LSI 1 can be maintained at a low temperature at which high-speed operation is performed.

The heat transmitted to the substrate 2 will be also transferred to the packaging board 8 through the pin 12 to increase temperatures of the pin 12 and the packaging board 8. It is therefore possible to maintain even the pin 12 or the packaging board 8 into which insertion of a heat insulating material having a sufficient thickness is hard to make due to structural difficulty at a temperature more than a dew point temperature, thereby preventing dewing.

Furthermore, a spare space is generated because dewing can be prevented without a heat insulating material, which facilitates arrangement of the guide mechanism 9 for guiding the pin 12 to securely fit in the through hole of the packaging board 8. As a result, a further effect can be produced of preventing erroneous insertion of the pin 12 into the packaging board 8.

The heat insulating cover 10 covering the whole outer surface of the cooling member 3 is intended to prevent dewing of the cooling member 3. It is also clearly understood that a temperature control unit for controlling a heater temperature can be attached to the heater 5 in order to set the temperature of the flange member 7 at an optimum temperature.

The amount of heat generation of the heater 5 is determined by a material or a size of the substrate 2, the amount of heat generation of the LSI 1, a junction set temperature of a CMOS and the temperature of the cooling member 3, and when a cooling medium is used, it is determined by the temperature and cooling performance of the cooling medium, heat capacity of the multi-chip module 20 and the like.

In a case, for example, where the substrate 2 is a mullite substrate of 100 mm in size and the entire amount of heat generation of the LSI 1 is 100 W, simply setting the amount of heat generation of the heater 5 to be a few watts obtains about 10° C. of a temperature increase at the pin 12. Thus, the amount of heat generation of the heater 5 is a few percents, considerably smaller than the amount of heat generation of the multi-chip module 20. Moreover, since heat transfer of the heat transmitted to the substrate to the LSI 1 side is prevented by the thin film insulation layer, the junction temperature of the CMOS in the LSI 1 is allowed to have a temperature increase not more than 1° C. substantially without being affected by the heat generation of the heater 5.

Next, operation of the adapter 6 will be described. The heat insulating material 4 being compressed is filled in between the cooling member 3 and the adapter plate 6a and the heater 5 without leaving a space in order to enhance heat insulation effects between the cooling member 3 and the heater 5. Since the heat insulating material 4 is formed of styrene foam, urethane foam or the like in order to enhance heat insulation, it shrinks or expands due to cooling by the cooling member 3 or heat generated by the heater 5. As a result, when the adapter 6 fails to exist, a gap between the cooling member 3 and the LSI 1 changes.

In a case, for example, where the heat insulating material 4 shrinks, the space between the cooling member 3 and the LSI 1 is narrowed to result in exerting an excessive load on the LSI 1 having the smallest gap with the cooling member 3. Conversely, when the heat insulating material 4 expands, the space between the cooling member 3 and the LSI 1 is increased and in the largest space between the cooling member 3 and the LSI 1, silicone grease or compound filled therein will lose its function to disable the cooling member 3 to cool down the LSI 1.

In the present embodiment, therefore, the flange member 7 is firmly fixed to the cooling member 3 by means of the screw 13 with the adapter 6, the heater 5 and the heat insulating material 4 provided therebetween. As a result, even when the insulating material is going to shrink or expand due to cooling by the cooling member 3 or heat generated by the heater 5, the shrinkage/expansion can be prevented by the adapter 6, so that each LSI 1 of the multi-chip module 20 and the cooling member 3 can virtually maintain a fixed gap between each other.

In addition, a change of the support 6b caused by temperature is negligible as compared with a gap between the cooling member 3 and the LSI 1. This prevents such a problem that a gap between the cooling member 3 and the LSI 1 changes to exert an excessive load on the LSI 1 and a problem that conversely the LSI 1 and the cooling member 3 go physically apart from each other to reach a cooling-disabled level due to loss of heat conduction.

Figure 4:
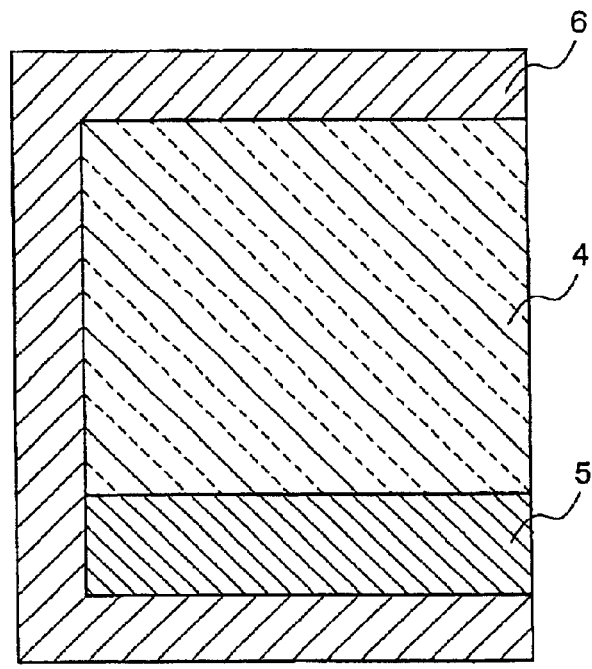
FIG. 4 is a sectional view of an adapter portion in a dewing prevention structure of an electronic device according to a second embodiment of the present invention.

FIG. 4 is a sectional view showing an adapter according to a second embodiment of the present invention. The adapter 6 of the second embodiment fails to have the hollow support (6b) of the first embodiment shown in FIG. 2 and has a U-shaped section. The frame-formed adapter 6 having a U-shaped section is disposed to cover the upper side surface of the flange member 7. Inside the U-shaped part of the adapter 6, the similarly frame-formed heater 5 is attached and in the remaining space, the heat insulating material 4 is filled. At this state, the heat insulating material 4, the heater 5 and the adapter 6 are fixed by screwing between the flange member 7 and the cooling member 3 similarly to the embodiment shown in FIG. 2.

Figure 5:
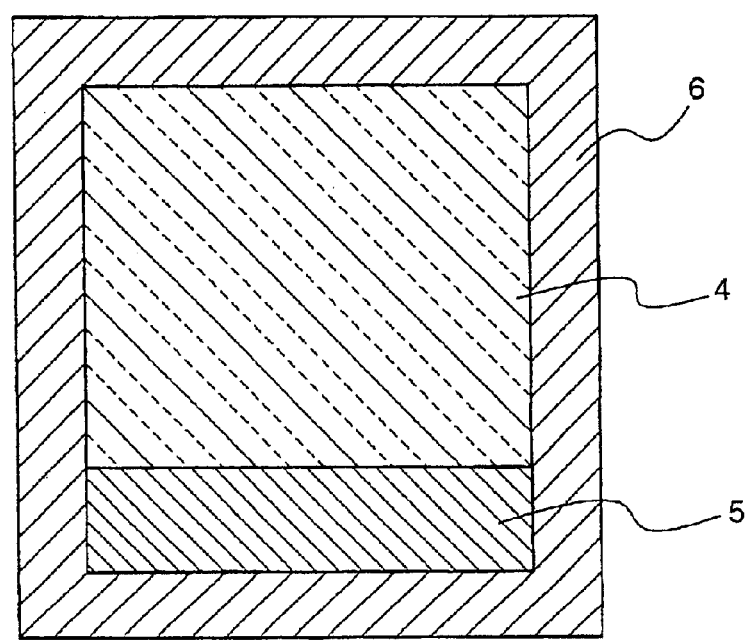
FIG. 5 is a sectional view of an adapter portion in a dewing prevention structure of an electronic device according to a third embodiment of the present invention.

FIG. 5 is a sectional view showing an adapter according to a third embodiment of the present invention. The adapter 6 of the present embodiment also fails to have the hollow support (6b) of the first embodiment shown in FIG. 2 and is the same as the adapter shown in FIG. 4 with the only difference being that its section is formed to be a hollow-square.

Other components than the adapter portions in the second and the third embodiments have the same structures as those of the first embodiment shown in FIG. 3. The second and the third embodiments may be modified to have the heater 5 arranged not within the adapter 6 but under the adapter (on the flange member).

Figure 6:
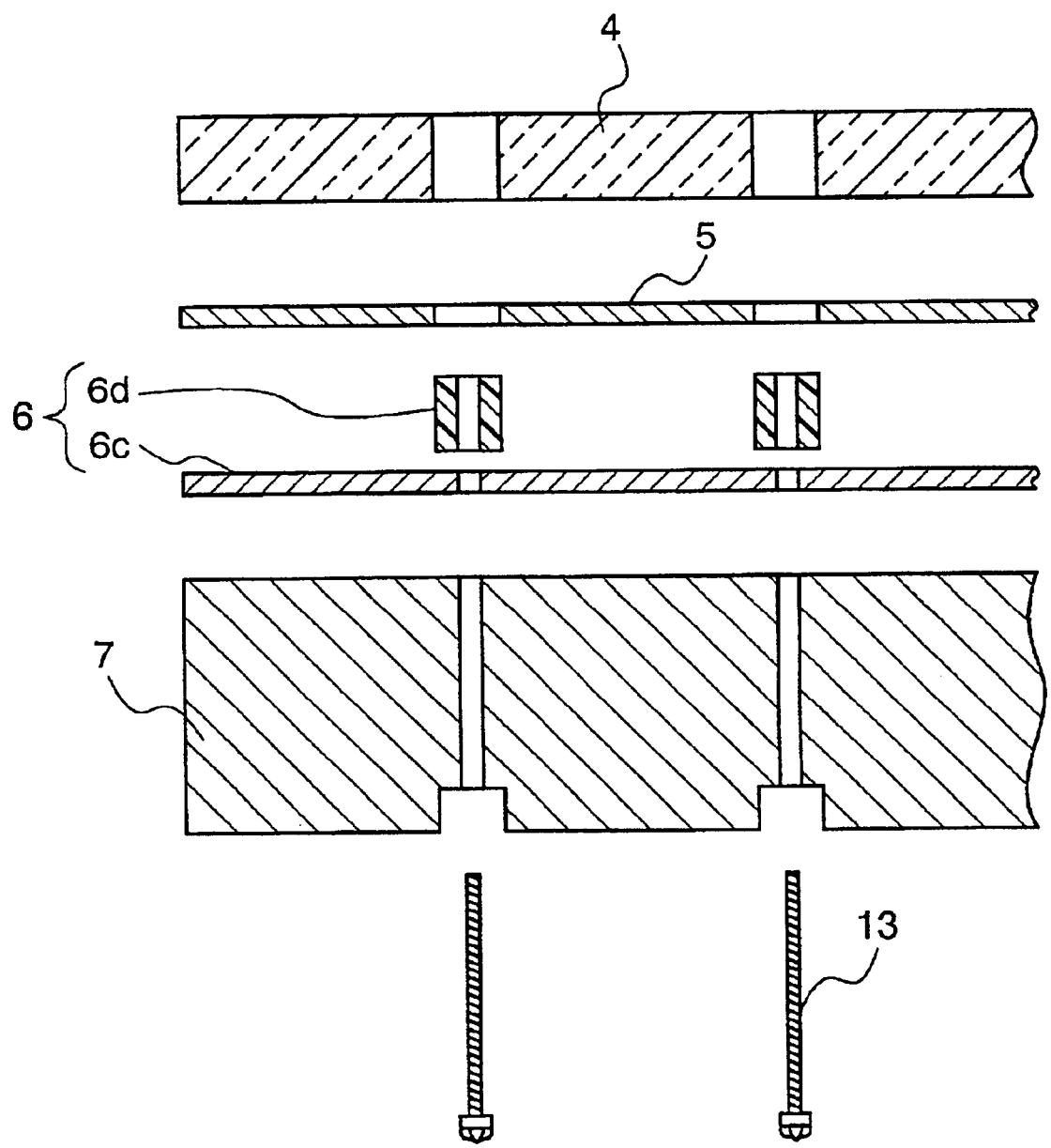
FIG. 6 is a partly exploded sectional view showing a dewing prevention structure of an electronic device according to a fourth embodiment of the present invention.

FIG. 6 is a partly exploded sectional view showing a fourth embodiment of the present invention. The difference in the present embodiment from the first embodiment shown in FIG. 2 is that the adapter 6 is composed of separate adapter plate 6c and support 6d. Designing the adapter plate 6c and the support 6d as separate bodies allows them to be made of a highly heat-conductive body and a material having high heat insulation, respectively. In other words, it is possible to form the adapter plate 6c out of a metal and the support 6d out of ceramic or plastics.

Figure 7:
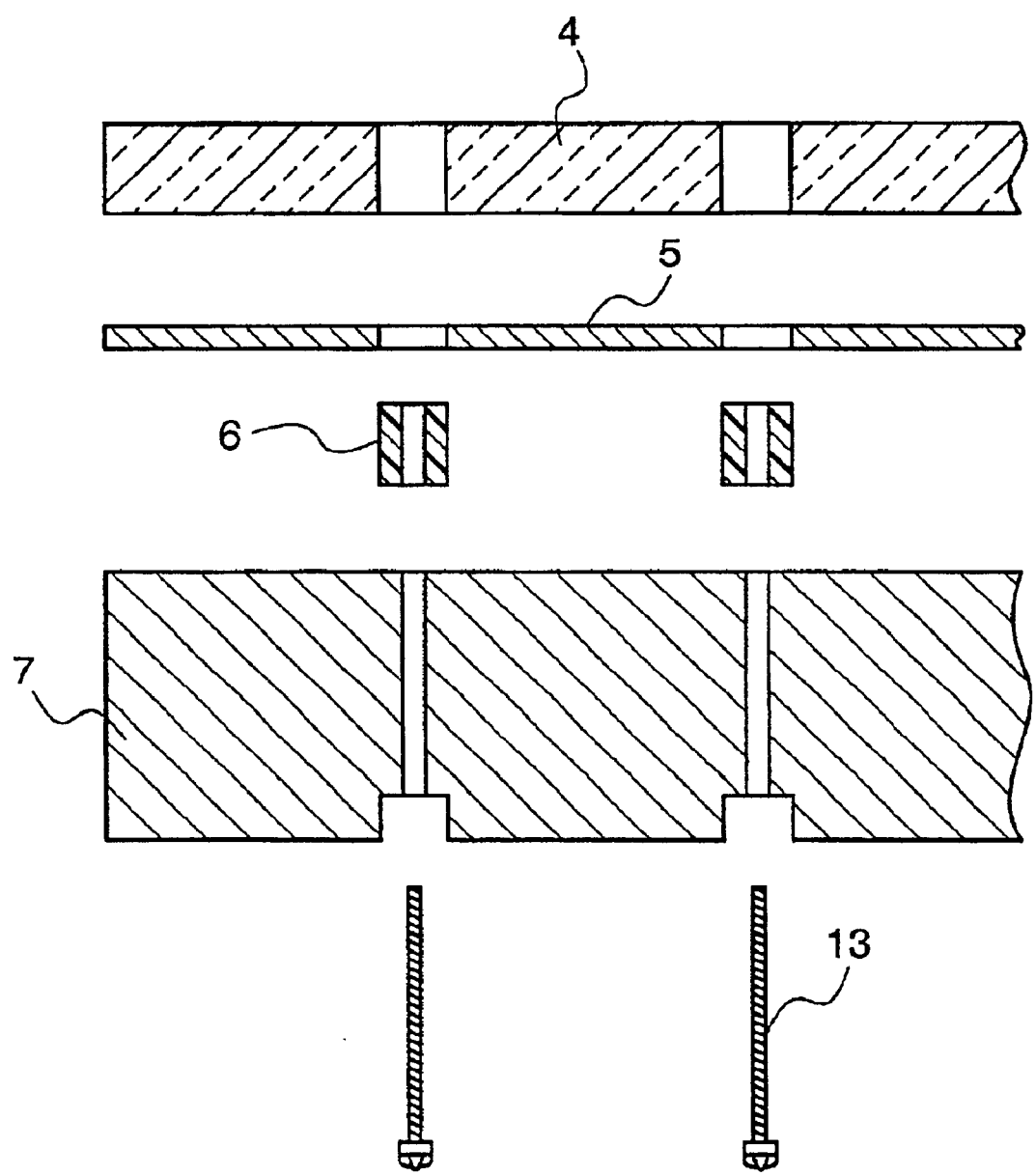
FIG. 7 is a partly exploded sectional view showing a dewing prevention structure portion of an electronic device according to a fifth embodiment of the present invention.

FIG. 7 is a partly exploded sectional view showing a fifth embodiment of the present invention. The difference in the present embodiment from the first embodiment shown in FIG. 2 is that the adapter 6 is composed only of a support without having an adapter plate portion.

In the present embodiment, therefore, the heater 5 directly comes into contact with the flange member 7. In the present embodiment, because it is desirable that the adapter 6 should be an element having low heat conductivity, it is formed of ceramic or plastics.

Figure 8:
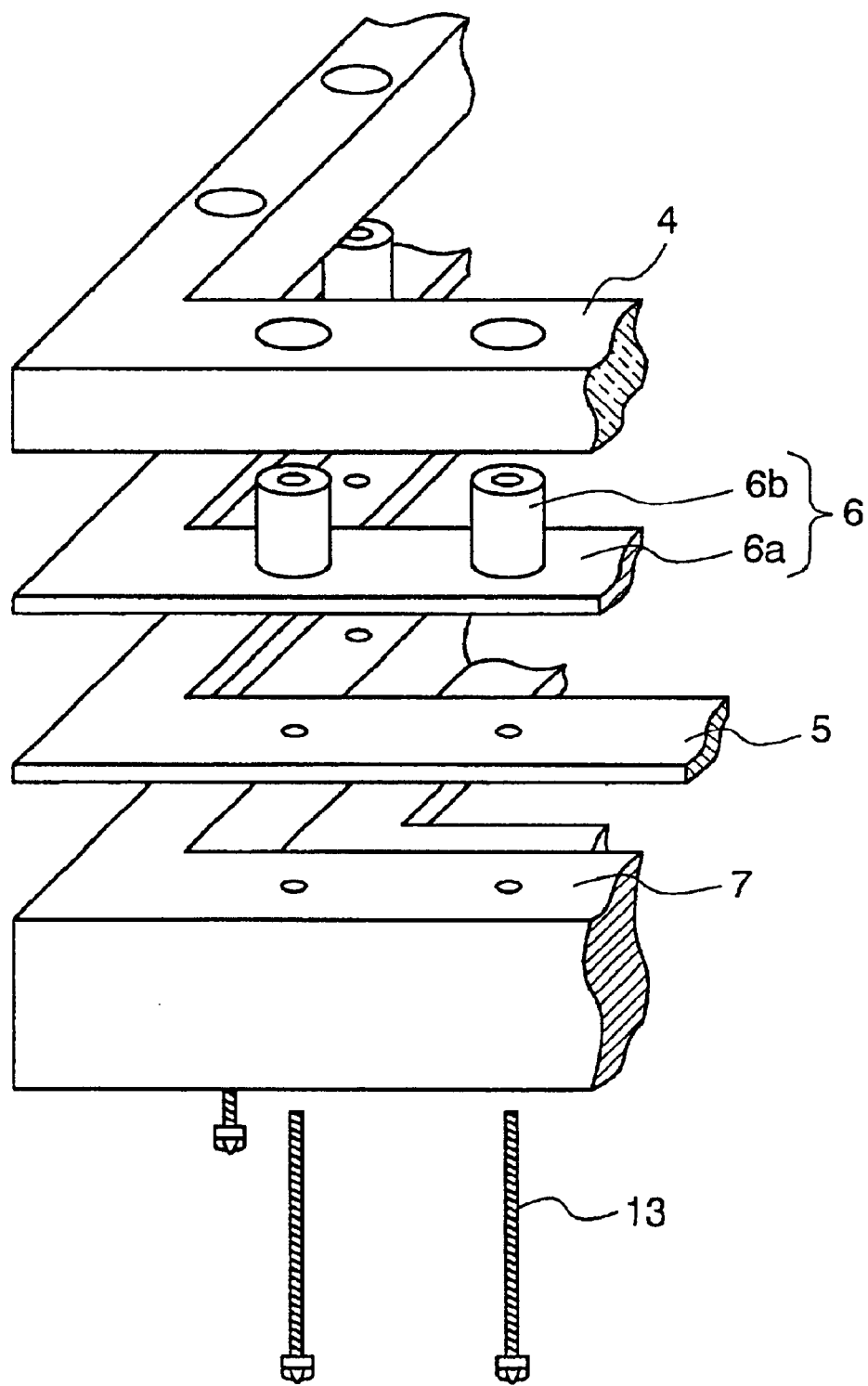
FIG. 8 is a partly exploded perspective view showing a dewing prevention structure portion of an electronic device according to a sixth embodiment of the present invention.

FIG. 8 is a partly exploded perspective view showing a sixth embodiment of the present invention. The difference in the present embodiment from the first embodiment shown in FIG. 2 is that the heater 5 is inserted between the adapter 6 and the flange member 7.

In the present embodiment, since the heater 5 is disposed being in contact with the flange member 7, the adapter 6 can be made of an element having low heat conductivity. In addition, since a hole formed in the heater 5 can be small, local heat increase occurring at the heater 5 can be suppressed.

Although the present invention has been described with respect to the preferred embodiments in the foregoing, it is not limited to those embodiments but allows such modification as follows.

For example, although in the embodiments, the heater is disposed on the upper surface of the flange member, the arrangement of the heater is not necessarily limited thereto and any arrangement is allowed in which the heater can perform its function such as arrangement between the substrate 2 and the flange member 7 or on the side surface or the lower surface of the flange member 7.

The heater can be also formed as a thick film or a thin film resistor on the flange member. It is also possible to provide the adapter 6 with a heater function. It is further possible to make the flange member 7 itself generate heat.

As described in the foregoing, since the present invention is structured to have the surroundings of the substrate mounted with the semiconductor device supported by the heated flange member, the substrate can be evenly and efficiently heated.

The present invention accordingly enables reduction of power consumed for cooling and heating to avoid an excessive temperature increase, as well as preventing a temperature of a substrate, a pin related to the substrate, a packaging board or the like from decreasing below a dew point temperature substantially without affecting a junction temperature of an LSI.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An electronic device comprising:
   a semiconductor device, a substrate on which the semiconductor device is mounted, a flange member for holding a peripheral portion of the substrate and a cooling member,
   a dewing prevention structure in which said semiconductor device and said cooling member are thermally connected by fixing said flange member to said cooling member, wherein
   said flange member has a heating function.

2. The electronic device as set forth in claim 1, wherein said flange member has a surface on which a heater is disposed.

3. The electronic device as set forth in claim 2, wherein said heater is disposed at an interface between said flange member and said cooling member and/or an interface between said flange member and the peripheral portion of said substrate.

4. The electronic device as set forth in claim 1, wherein said flange member is a heating element.

5. The electronic device as set forth in claim 1, wherein said flange member has a bottom surface portion in which an opening is formed at the central portion and a square cylinder portion standing upright at a peripheral portion of the bottom surface portion to hold said substrate at said bottom surface portion.

6. The electronic device as set forth in claim 5, wherein said flange member is fixed to said cooling member at a top face of said square cylinder.

7. The electronic device as set forth in claim 1, wherein said flange member is formed of metal.

8. The electronic device as set forth in claim 7, wherein the surface of said flange member is coated with an insulating material.

9. The electronic device as set forth in claim 1, wherein between said cooling member and said flange member, a heat insulating member is inserted.

10. The electronic device as set forth in claim 1, wherein said heat insulating member is formed of a plastic material having closed cells.

11. The electronic device as set forth in claim 9, wherein between said cooling member and said flange member, an adapter for regulating movement of said heat insulating material is inserted.

12. The electronic device as set forth in claim 11, wherein said heat insulating member is accommodated in said adapter.

13. The electronic device as set forth in claim 11, wherein said adapter is made up of at least a hollow support piercing through said heat insulating member, or at least the hollow support piercing through said heat insulating member and a plate-shaped adapter plate.

14. The electronic device as set forth in claim 13, wherein said adapter is formed of metal.

15. The electronic device as set forth in claim 11, wherein said adapter functions also as a heater.

16. The electronic device as set forth in claim 11, wherein at least said hollow support of said adapter is formed of ceramic or plastics.

17. The electronic device as set forth in claim 11, wherein on the surface of said substrate, a heat insulating insulation layer is formed.

18. The electronic device as set forth in claim 1, wherein said heating function is provided with a temperature control function of controlling the temperature of said flange member.

19. A dewing prevention structure of an electronic device having a semiconductor device, a substrate on which the semiconductor device is mounted, a flange member for holding a peripheral portion of the substrate and a cooling member, wherein said semiconductor device and said cooling member are thermally connected by fixing said flange member to said cooling member, and said flange member has a heating function.

20. The dewing prevention structure of an electronic device as set forth in claim 19, wherein said flange member has a surface on which a heater is disposed.

21. The dewing prevention structure of an electronic device as set forth in claim 20, wherein the heater is disposed at an interface between said flange member and said cooling member and/or an interface between said flange member and the peripheral portion of said substrate.

22. The dewing prevention structure of an electronic device as set forth in claim 19, wherein said flange member has a bottom surface portion in which an opening is formed at the central portion and a square cylinder portion standing upright at a peripheral portion of the bottom surface portion to hold said substrate at said bottom surface portion.

23. The dewing prevention structure of an electronic device as set forth in claim 19, wherein said flange member is formed of metal and the surface of said flange member is coated with an insulating material.

24. The dewing prevention structure of an electronic device as set forth in claim 19, wherein between said cooling member and said flange member, a heat insulating member is inserted.

25. The dewing prevention structure of an electronic device as set forth in claim 19, wherein said heat insulating member is formed of a plastic material having closed cells.

26. The dewing prevention structure of an electronic device as set forth in claim 24, wherein between said cooling member and said flange member, an adapter for regulating movement of said heat insulating material is inserted.

27. The dewing prevention structure of an electronic device as set forth in claim 26, wherein said heat insulating member is accommodated in said adapter.

28. The dewing prevention structure of an electronic device as set forth in claim 26, wherein said adapter is made up of at least a hollow support piercing through said heat insulating member, or at least the hollow support piercing through said heat insulating member and a plate-shaped adapter plate.

29. The dewing prevention structure of an electronic device as set forth in claim 26, wherein said adapter functions also as a heater and at least said hollow support of said adapter is formed of ceramic or plastics.

30. The dewing prevention structure of an electronic device as set forth in claim 26, wherein on the surface of said substrate, a heat insulating insulation layer is formed.

31. The dewing prevention structure of an electronic device as set forth in claim 19, wherein said heating function is provided with a temperature control function of controlling the temperature of said flange member.

\* \* \* \* \*